(12) United States Patent
Ciemniak

(10) Patent No.: US 6,466,084 B1
(45) Date of Patent: Oct. 15, 2002

(54) CIRCUIT FOR REDUCING THIRD ORDER INTERMODULATION DISTORTION FOR A BROADBAND RF AMPLIFIER

(75) Inventor: Hartmut Ciemniak, Holle (DE)

(73) Assignee: General Instrument Corporation, Horsham, PA (US)

( * ) Notice: Subject to any disclaimer, the term of this patent is extended or adjusted under 35 U.S.C. 154(b) by 0 days.

(21) Appl. No.: 09/489,625

(22) Filed: Jan. 24, 2000

(51) Int. Cl.$^7$ ................................................ H03B 1/00
(52) U.S. Cl. ...................... 327/553; 327/307; 327/362; 327/513; 455/114; 455/296
(58) Field of Search ................................ 327/551, 552, 327/553–555, 512, 513, 362, 307–311; 330/149, 295; 455/114, 296, 302; 359/161

(56) References Cited

U.S. PATENT DOCUMENTS

| 4,808,810 A | 2/1989 | Van Doorn | 250/214 A |
| 4,882,482 A | 11/1989 | Smith et al. | 250/214 A |
| 4,992,754 A | 2/1991 | Blauvelt et al. | 330/149 |
| 4,998,012 A | 3/1991 | Kruse | 250/214 A |
| 5,161,044 A | 11/1992 | Nazarathy et al. | 359/157 |
| 5,172,068 A | 12/1992 | Childs | 327/100 |
| 5,321,710 A | 6/1994 | Cornish | 372/26 |
| 5,418,637 A | 5/1995 | Kuo | 359/161 |
| 5,424,680 A | 6/1995 | Nazarathy et al. | 330/149 |
| 5,455,705 A | 10/1995 | Gusinov | 359/189 |
| 5,481,389 A | 1/1996 | Pidgeon et al. | 359/161 |
| 5,523,716 A | 6/1996 | Grebliunas et al. | 330/149 |
| 5,568,087 A | 10/1996 | Gatti | 330/149 |
| 5,589,797 A | 12/1996 | Gans et al. | 330/149 |
| 5,600,472 A | * 2/1997 | Uesaka | 359/161 |
| 5,703,530 A | 12/1997 | Sato et al. | 330/149 |
| 5,752,174 A | 5/1998 | Matai et al. | 455/183.1 |
| 5,798,854 A | 8/1998 | Blauvelt et al. | 359/161 |
| 5,850,305 A | 12/1998 | Pidgeon | 359/187 |
| 5,909,642 A | 6/1999 | Suzuki | 455/114 |
| 6,069,534 A | 5/2000 | Kobayashi | 330/308 |
| 6,107,877 A | * 8/2000 | Miguelez et al. | 330/66 |
| 6,122,085 A | 9/2000 | Bitler | 359/180 |
| 6,204,718 B1 | 3/2001 | Pidgeon | 327/318 |

FOREIGN PATENT DOCUMENTS

| DE | 3024533 | 1/1982 | |
| DE | 3338024 | 5/1985 | |
| DE | 4212772 | 10/1993 | H04H/1/00 |
| DE | 2656436 | 6/1998 | H03F/1/32 |
| EP | 0498456 | 2/1992 | H03F/1/32 |
| EP | 0552316 | 2/1992 | H04B/10/18 |
| EP | 486953 | 5/1992 | |
| EP | 0620661 | 10/1994 | |
| GB | 1381597 | 1/1975 | |
| GB | 2164515 | 3/1996 | |
| WO | 9735390 | 9/1997 | |

OTHER PUBLICATIONS

Optical Receiver Front–End Nonlinear Distortion, Electronics Letters, Apr. 29, 1982, vol. 18, No. 9, pp. 361–362.

(List continued on next page.)

Primary Examiner—Timothy P. Callahan
Assistant Examiner—Minh Nguyen
(74) Attorney, Agent, or Firm—Volpe and Koenig, P.C.

(57) ABSTRACT

A distortion control circuit for selective modulation of an RF signal includes an input port for coupling with an RF signal source, such as a multifrequency CATV signal, an output port for coupling to an associated RF amplifier, and a pair of selectively biased diodes for generating new third order products from the multifrequency RF signal which are the same magnitude, but opposite in phase to the nonlinear products generated by the RF amplifier. Since both the original multifrequency RF input signal and the new generated products from the distortion control circuit are applied to the input of the RF amplifier, the nonlinear products from the distortion control circuit and the RF amplifier will be canceled and the output of the RF amplifier will comprise only the multifrequency RF signal.

10 Claims, 2 Drawing Sheets

OTHER PUBLICATIONS

Bertelsmeier et al., Linearization of Broadband Optical Transmission Systems by Adaptive Predistortion, 1984, pp. 206–212.

Ohr, GaAs Finds Home In Wireless & High–Speed Data–Communications Applications, Computer Design, Mar. 1994, pp. 59–68.

Eggers, 2GHz Bandwidth Predistortion Linearizer For Microwave Power Amplifiers At Ku–Band, pp. 1501–1505, Sep. 1994.

Eggers, Pamela—Linearized Solid State Power Amplifier At Ku–band Frequency, pp. 443–445 Sep. 1993.

Khilla et al., Semiconductor Transmitter Amplifiers And Traveling Wave Tube Linears For Future Communications Satellites, 8273 ANT Telecommunications Engineering Reports, No. 8, Feb. 1991 (including English translation).

Locatelli et al., Microwave Linear Power Amplifier With Micromodule Technology, pp. 1.3.1–1.3.6, Jun. 1987.

Kobayashi et al., A Novel Monolithic Linearized HEMT LNA using HBT Tuneable Active Feedback, Jun. 1996, pp. 1217–1220.

* cited by examiner

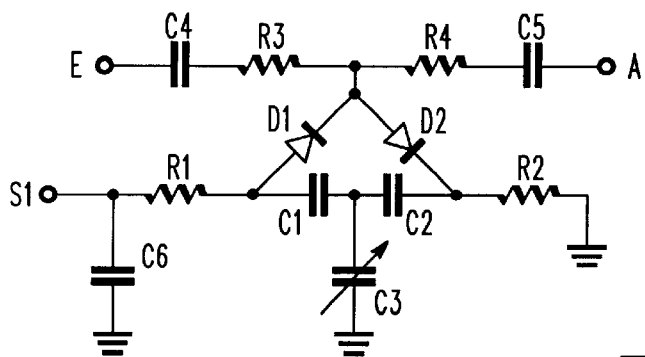
*FIG. 1*
*FIG. 2*
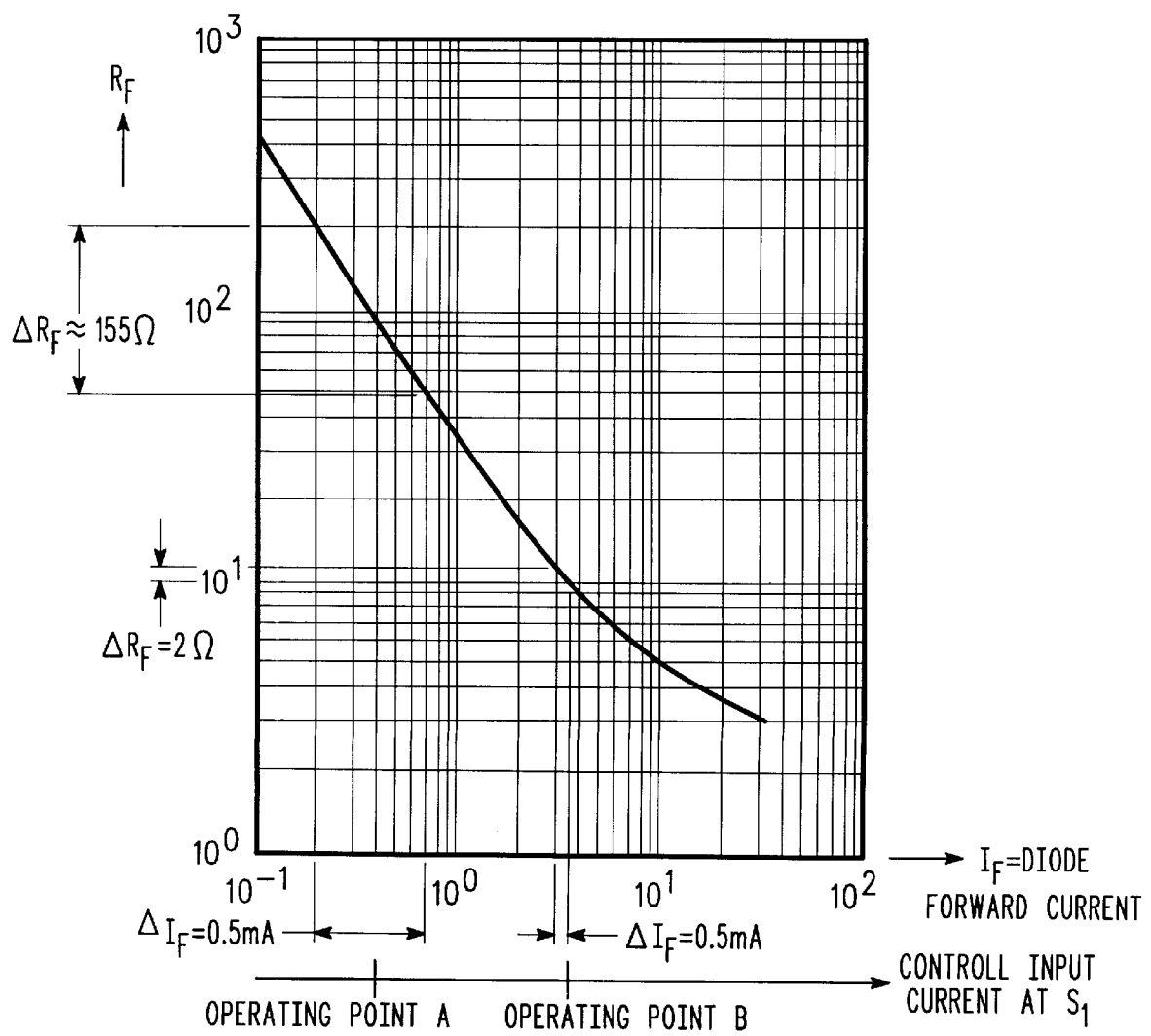

CIRCUIT FOR REDUCING THIRD ORDER INTERMODULATION DISTORTION FOR A BROADBAND RF AMPLIFIER

BACKGROUND OF THE INVENTION

This invention relates generally to radio frequency (RF) amplification. More particularly, the invention relates to a system for reducing third order intermodulation distortion in broadband CATV RF amplifiers.

Lowering distortion in RF power amplifier circuits without compromising their transient response is an omnipresent problem. High frequency amplification is widely used in communications and broadcasting and also where high-speed switching is required for use in digital instrumentation. However, high frequency amplifier applications extend linear operation into areas where parasitic effects of inter-electrode capacitance, wire inductance, stored charge and even operating frequency wavelength begin to adversely affect and dominate circuit behavior.

Minimizing distortion is particularly important when a series of amplifiers is cascaded over a signal transmission path, such as a series of RF amplifiers in a CATV transmission network. Disposed throughout a CATV transmission system are RF amplifiers that periodically amplify the transmitted signals to counteract cable attenuation and attenuation caused by passive CATV components, such as signal splitters and equalizers. The RF amplifiers are also employed to maintain the desired carrier-to-noise ratio. Due to the number of RF amplifiers employed in a given CATV transmission system, each RF amplifier must provide minimum degradation to the transmitted signal.

In an ideal communication system it is preferable that the components which comprise the system are linear. However, as a practical reality, there are many nonlinearities that are typically introduced by the electronic components, such as RF amplifiers. The distortions created by an RF amplifier which are of primary concern are second (even) and third (odd) order harmonic distortions. Prior art amplifier designs have attempted to ameliorate the effects of even order distortions by employing push-pull amplifier topologies, since the maximum even order cancellation occurs when the proper 180° phase relationship is maintained over the entire bandwidth. This is achieved through equal gain in both push-pull halves by matching the operating characteristics of the active devices.

However, odd-order distortion is difficult to remedy. Odd-order distortion characteristics of an amplifier are manifest as cross modulation (X-mod) and composite triple beat (CTB) distortions on the signal being amplified. These are two types of intermodulation (IM) distortion. X-mod occurs when the modulated contents of one channel being transmitted interferes with and becomes part of an adjacent or non-adjacent channel. CTB results from the combination of three frequencies of carriers occurring in the proximity of each carrier since the carriers are typically equally spaced across the frequency bandwidth. Of the two noted distortions, CTB becomes more problematic when increasing the number of channels on a given CATV system. While X-mod distortion also increases in proportion to the number of channels, the possibility of CTB is more dramatic due to the increased number of available combinations from among the total number of transmitted channels. As the number of channels transmitted by a communication system increases, or as the channels reside closer together, the odd-order distortion becomes a limiting factor of amplifier performance.

The nonlinear properties of an RF amplifier can be described by a curve which can be expanded into a Taylor series as follows:

$$Uout = a_1 \cdot U_{in} + a_2 \cdot U_{in}^2 + a_3 \cdot U_{in}^3 + a_4 \cdot U_{in}^4 + a_5 \cdot U_{in}^5 \ldots a_n \cdot U_{in}^n,$$

Equation 1 where $U_{in}$ is the input potential and Uout is the output potential and $a_n$ is a factor that determines the magnitude of the term. It should be noted that $a_1 \cdot U_{in}$ is the 1st order term; $a_2 \cdot U_{in}^2$ is the 2nd order term; $a_3 \cdot U_{in}^3$ is the 3rd order term . . . and $a_n \cdot U_{in}^n$ is the nth order term. The magnitudes of the individual terms are strongly dependent on the input signal and, therefore, on the level control of the amplifier.

If we have the following:

$$U_{in} = A \cdot \cos \omega_i t$$

Equation 2

There exists for each term multiple combination possibilities of the input circulating frequencies $\omega_i$ due to the power of the corresponding order number. Additionally, in multifrequency transmission systems, such as a CATV transmission network, the number of new circulating frequencies at the output of the network increases exponentially with the number (i) of frequencies at the input. These new circulating frequencies are referred to herein as intermodulation (IM) products and are detrimental to the accurate acquisition of CATV signals.

Using the Taylor series, it can be demonstrated that all odd order terms create products which appear at the same location as the lower-valued odd order terms. Therefore, the third order term creates a product at the base frequency, (odd order number 1), the fifth order term creates a product at the third order and one at the base frequency. If the input signal consists, for example, of the base circulating frequencies $\omega_1$ and $\omega_2$ (i=2) with the same amplitude A, that is expressed with:

$$U_{in} = A\cos(\omega_1 t) + A\cos(\omega_2 t)$$

$$= 0.5A(e^{j\omega_1 t} + e^{-j\omega_1 t} + e^{j\omega_2 t} + e^{-j\omega_2 t}),$$

Equation 3 then the third order term $a_3 \cdot U_{in}^3$ of Equation 1, (which is of interest in the present application), creates the following new products: $\pm\omega_1$; $\pm\omega_2$; $\pm 3\omega_1$; $\pm 3\omega_2$; $\pm(2\omega_2 \pm \omega_1)$; $\pm(2\omega_1 \pm \omega_2)$. In this case there are 16 new circulating output frequencies due to two input circulating frequencies.

A "weakly" nonlinear transmission system can be defined such that: a) the effect of odd order terms on other lower-valued odd order terms is negligibly small; and b) higher-valued terms after the third order term are negligibly small. Accordingly, a weakly nonlinear system may be mathematically described such that the Taylor series is broken off after the third order term $(a_3 \cdot U_{in}^3)$. Weakly nonlinear systems are characterized in that a 1 db increase in the level of the input circulating frequencies $\omega_i$ causes an increase of 3 db in the third order IM products.

Communication systems, such as CATV systems which include broadband RF amplifiers, are further regarded as dynamically nonlinear systems whereby the amplitudes and phases of the IM products are dependent upon the input frequencies.

There are three basic ways of correcting distortion created by a non-linear device: 1) reduce the signal power level; 2) use a feed forward technique; and 3) use a predistortion or postdistortion technique. The first method reduces the signal power level such that the non-linear device is operating in its linear region. In the case of an RF amplifier this results in very high power consumption for low RF output power. Of course, the high power consumption is a disadvantage. However, this method is not an option if high output level is required on a permanent basis.

The second method is the feed forward technique. Using this technique, the input signal of the main amplification circuit is sampled and compared to the output signal to determine the difference between the signals. This difference is the distortion component which is amplified by an auxiliary amplification circuit and combined with the output of the main amplification circuit such that the two distortion components cancel each other. However, the power consumed by the auxiliary amplification circuit is comparable to that consumed by the main amplification circuit and the circuitry is also complex and expensive. At the upper frequency limit it is very difficult to maintain the magnitude and phase conditions with respect to temperature.

The third method is the pre- or post-distortion technique. Depending upon whether the compensating distortion signal is generated before the non-linear device or after, the respective term predistortion or postdistortion is used. In this technique, a distortion signal equal in amplitude but opposite in phase to the distortion component generated by the amplifier circuit is estimated and generated. This is used to cancel the distortion at the input (for predistortion) or output (for postdistortion) of the amplifier, thereby improving the operating characteristics of the amplifier.

SUMMARY

The present invention is a distortion control circuit for selective modulation of an RF signal. The present invention includes an input port for coupling with an RF signal source, such as a multifrequency CATV signal, and an output port for coupling to an associated electrical circuit such as a hybrid RF amplifier. Hybrid RF amplifiers are known for generating unwanted nonlinear characteristics, particularly second and third order products. The present invention generates new third order products from the multifrequency RF signal which are the same magnitude, but opposite in phase to the nonlinear products generated by the hybrid RF amplifier. Since both the original multifrequency RF input signal and the new generated products from the invention are coupled to the input of the hybrid RF amplifier, the nonlinear products from the present invention and the hybrid RF amplifier will be canceled and the output of the hybrid RF amplifier will comprise only the multifrequency RF signal. The distortion control circuit includes a nonlinear circuit having a pair of diodes which are selectively biased to create a distortion product for adding to the input signal which is opposite in phase and equal in magnitude to any distortion created by the hybrid RF amplifier. The present inventive circuit is particularly adaptable weakly nonlinear systems and provides the ability to largely match the dynamically nonlinear behavior of a system to be compensated and achieve compensation over a frequency range of at least 860 MHz.

Accordingly, it is an object of the present invention to provide a circuit for reducing third order intermodulation distortion for a broadband RF amplifier.

Other objects and advantages of the system and the method will become apparent to those skilled in the art after reading a detailed description of the preferred embodiment.

BRIEF DESCRIPTION OF THE DRAWINGS

FIG. 1 is a schematic diagram of a circuit for reducing third order intermodulation distortion in accordance with the present invention.

FIG. 2 is a graph of the diode differential forward resistance $R_F$ verses the diode forward current $I_F$.

DETAILED DESCRIPTION OF THE INVENTION

Figure 3:
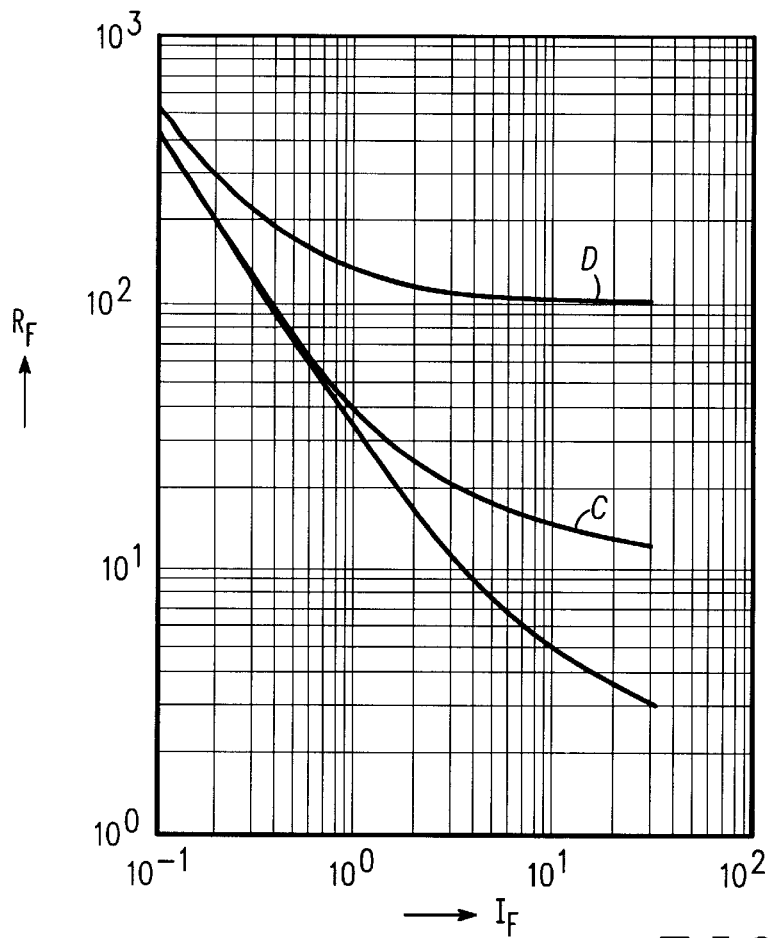
FIG. 3 is a graph of the diode differential forward resistance $R_F$ verses the diode forward current $I_F$ with different resistors in series with the diode.

The preferred embodiment of the present invention will be described with reference to the drawing figures where like numerals represent like elements throughout.

One basic structural element for a compensator is a nonlinear element. In accordance with the present invention, the nonlinear element is preferably a Schottky diode pair. Diode current $I_F$ and diode voltage $U_F$ are generally related by the following equation:

$$I_F = I_0(e^{U_F/m \cdot U_T} - 1);\qquad\text{Equation 4}$$

where: $I_F$ is the diode forward current; $I_0$ is the diode inverse current; $U_F$ is the diode forward voltage; m is a correction factor with a value between 1 and 2; and $U_T$ is the temperature dependent voltage which can be written as:

$$U_T = \frac{k \cdot T}{e_o};\qquad\text{Equation 5}$$

whereby:

k=Boltznann's—constant (physical constant);

T=temperature in kelvin; and $e_o$=electrical element charge (physical constant).

Accordingly, $U_T$ is a constant for a certain temperature, (for example, 25 mV at 23° C.). The Taylor series of an exponential function yields a relatively large third order term:

$$e^x = 1 + \frac{x}{(1!)} + \frac{x^2}{(2!)} + \frac{x^3}{(3!)}\qquad\text{Equation 6}$$

Equation 4 can be approximated by:

$$I_F \approx I_0 e^{k U_F}\qquad\text{Equation 7}$$

Which means that the diode forward current $I_F$ is proportional to an e-function with the diode forward voltage $U_F$ in its exponent. Since the diode is part of the inventive circuit, $U_F$ is part of $U_{in}$ and Equation 7 can be rewritten as:

$$I_F \approx I_0 e^{k \cdot U_{in}}\qquad\text{Equation 8}$$

Assuming that $k \cdot U_{in}$ is x, and inserting it into Equation 6, the third order term $x^3/3!$ will produce the same products, (i.e., compensating products generated by the diode), as shown by Equation 3.

To achieve phase opposition of the compensating IM products relative to those of the object to be compensated, the nonlinear element is connected in accordance with the preferred embodiment of the present invention in the transverse branch of a T-member as shown in FIG. 1. If the nonlinear element was arranged in the length branch of an equivalent T-member, the IM products would be in phase relative to those to be compensated, (provided the diodes in the two cases operate at the same operating points), and compensation would be impossible.

The system 10 for reducing third order IM in accordance with the present invention is located between an input E and an output A. The input E comprises a multifrequency operating signal, for example a CATV signal having plurality of CATV channels. The output A is connected to a system to be compensated, for example a hybrid RF amplifier. As is well known by those skilled in the art, the RF amplifier not only amplifies the output A, but also introduces undesired IM products. These IM products are compensated for by the present invention. As shown, the system 10 is a circuit which comprises a plurality of resistors $R_1$, $R_2$, $R_3$, $R_4$; a plurality of capacitors $C_1$, $C_2$, $C_3$, $C_4$, $C_5$, $C_6$; and a nonlinear element comprising two Schottky barrier diodes $D_1$, $D_2$. As will be explained in detail hereinafter, the present invention produces third order "compensating" IM products, (including cross-modulation products), which exhibit the same amplitude but opposite phase to the RF amplifier-generated IM products. The compensating IM products are added at the node connecting the two resistors $R_3$ and $R_4$ and the two diodes $D_1$ and $D_2$ such that the compensating IM products are added to the multifrequency operating signal and output at output A.

A control input $S_1$ is provided to control the operating point of the diodes $D_1$, $D_2$ and thereby control the magnitude of compensating IM products. At the control input $S_1$, a direct current (DC) is supplied which flows through diodes $D_1$ and $D_2$ and determines the operating point of the diodes $D_1$, $D_2$. A DC current change at the control input $S_1$ influences the steepness of the diode characteristic. The change in the diode differential forward resistance RF in the lower segment of the diode characteristic is greater than in the upper segment, provided that the change of $I_F$ is the same in both cases.

A graph of the diode differential forward resistance $R_F$ verses the diode forward current $I_F$ is shown in FIG. 2. It should be noted that this curve is an illustration of the frequency response at 10 KHz. As shown, the diode differential forward resistance $R_F$ is dependent upon both the diode operating point and the change in diode forward current $I_F$. For example, the DC current at the control input $S_1$ changes the operating point of the diodes $D_1$, $D_2$ from operating point A to operating point B. At operating point A, a change in the diode forward current $I_F$ of 0.5 mA results in a change in the diode differential forward resistance $R_F$ of 155Ω. However, at operating point B, a change in the diode forward current $I_F$ of 0.5 mA results in a change in the diode differential forward resistance $R_F$ of only 2Ω. The differential diode current $\Delta I_F$ is caused by the input level $U_{in}$. Since $U_{in}$ is an RF signal, it leads to an alternating diode current, as shown in Equation 8.

The magnitude of the compensating IM products is dependent upon the change in diode differential forward resistance $R_F$ as a function of the level of $U_{in}$. Accordingly, a low DC current input at $S_1$ leads to a greater magnitude of compensating IM products, and a high DC current input at $S_1$ correspondingly leads to a smaller magnitude of compensating IM products. By selectively controlling the DC current at input $S_1$, the magnitude of the compensating IM may be selectively controlled.

In accordance with the present invention, an additional method for adjusting the diode differential forward resistance $R_F$ characteristic is provided by the introduction of the resistors $R_1$ and $R_2$, which from an AC standpoint are in series with $D_1$ and $D_2$. The signal currents are conducted from $D_2$ via $R_2$ directly to ground and from $D_1$ via $R_1$ and $C_6$ to ground. $C_6$ is a blocking capacitor whose complex resistance is negligibly small for all applied frequencies of the multifrequency input signal. The resistors $R_1$ and $R_2$ affect the diode differential forward resistance $R_F$ characteristic by flattening the characteristic, thereby influencing the magnitude of the compensating IM products. Referring to FIG. 3, a graph of the diode differential forward resistance $R_F$ verses the diode forward current $I_F$ is shown. It can clearly be seen that as the value of the two resistors $R_1$, $R_2$ is increased from 10Ω to 100Ω, the diode differential forward resistance $R_F$ characteristics changes from curve C to curve D.

Because of the circuit symmetry required to eliminate the second order terms, the resistors $R_1$, $R_2$ have the same values and simultaneously play the role of symmetry resistors, in that they equalize the potentially different diodes $D_1$, $D_2$. The symmetry resistors $R_1$ and $R_2$ decouple the two diodes $D_1$, $D_2$ from each other and lead to symmetrical compensating IM products. In this manner, any deviations in the characteristics of both diodes $D_1$, $D_2$ are minimized.

The diode differential forward resistance $R_F$ is frequency dependent due to the complex parasitic effects of the diodes $D_1$, $D_2$. As the diode current $I_F$ decreases, the influence of the parasitic elements increases. The detrimental diffusion capacitance of the diodes $D_1$, $D_2$, (which parallels the diode differential forward resistance $R_F$), prevents the signal energy at the upper frequency limit from entering into the diode differential forward resistance $R_F$. This leads to a reduction of the compensating IM products at high frequencies. Unfortunately, a high level of compensating IM products is particularly required at high frequencies because the IM products in RF amplifiers inherently increase with signal frequency due to the circuit-produced reverse coupling, which becomes less effective at high frequencies.

In order to counteract the parasitic effects, capacitors $C_1$, $C_2$ and $C_3$ are provided. The common variable capacitor $C_3$ is used to match the frequency distribution of the IM products of the RF amplifier, thereby achieving optimal broadband compensation. By providing the equalizing element $C_3$, the required symmetry conditions can always be obtained independently of its adjustment. The capacitors $C_4$ and $C_5$ serve exclusively for blocking the direct components at the input E and output A, and their capacitances are large enough such that they do not affect the multifrequency operating signal. Together with $R_1$ and $R_2$, the capacitors $C_1$, $C_2$ and $C_3$ provide frequency-dependent resistances, such that they permit a desired and controllable level of increase of the compensating IM products at high frequencies. The flattening of the diode characteristic at high frequencies is counteracted by the reduction of the complex series resistances. As a result, the diode characteristic steepens not only at high frequencies, but an increase in steepness can also be realized if desired.

In accordance with the teachings of the present invention, an improvement of 8 db to 15 db in CTB and X-mod may be expected depending upon the hybrid RF amplifier to which the system 10 is coupled.

Figure 4:
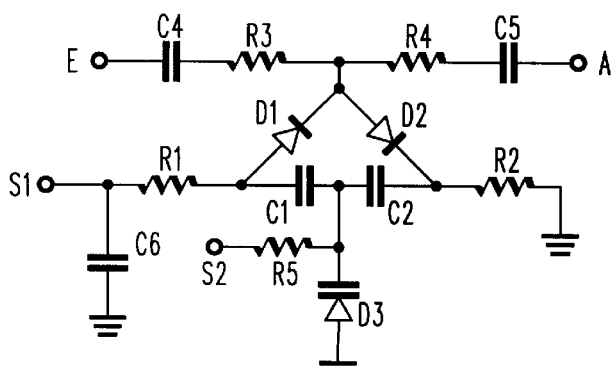
FIG. 4 is an alternative embodiment of the present invention.

An alternative embodiment 20 of the present invention is shown in FIG. 4. In this alternative embodiment 20, $C_3$ is replaced by the variable capacitance diode $D_3$. An input $S_2$ is provided for connection to a variable DC voltage. This permits electrical adjustments, for example, when the circuit 20 is integrated into a hybrid RF amplifier. The value of $R_5$ is chosen to be very high so that there is no adverse influence to the RF transmission behavior of the distortion system, (i.e., no adverse influence on insertion loss and return loss over the range of operating frequencies).

Figure 5:
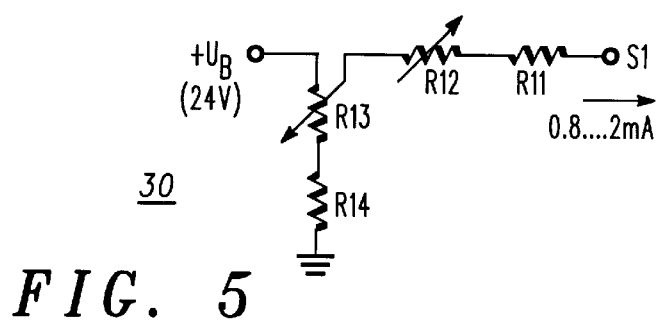
FIG. 5 is a bias control for the present invention.

Referring to FIG. 5, a bias control 30 for the input $S_1$ of FIGS. 1 and 4 is shown. The input voltage+$U_B$ is the operating voltage which has a fixed value. In the present case, the fixed value is 24 volts DC, which corresponds to the operating voltage of a hybrid RF amplifier. As those skilled in the art would appreciate, the value of $+U_B$ may be different in other applications. $R_{12}$ is a resistor with a positive temperature coefficient to compensate temperature effects. It should be noted that although $R_{12}$ improves the temperature behavior, this resistor is optional. With the insertion of $R_{12}$ it is possible to realize temperature compensation of the RF hybrid, (i.e., increased compensation as the temperature increases). Since $R_{13}$ is variable, it permits adjustment of the compensation effect of the IM products.

Table 1 below sets forth the component values for the components shown in FIGS. 1, 4 and 5. It should be clearly recognized by those skilled in the art that these component values have been selected for the particular application and desired frequency range. These component values are illustrative only and should not be considered to be an essential part of the present invention since they will change depending upon the operating range of the system in which the distortion circuit is utilized and the amplifier to which the distortion circuit is coupled. The values should not be viewed as limiting.

TABLE 1

| Component | Value |
|---|---|
| $C_1$ | 0.5 pF |
| $C_2$ | 0.5 pF |
| $C_3$ | 0.5–2 pF |
| $C_4, C_5, C_6$ | 1 nF |
| $R_1, R_2$ | 300 Ω to 750 Ω (dependent on application) |
| $R_3, R_4$ | 3.9 Ω |
| $R_5$ | 10 kΩ–100 kΩ |
| $D_1, D_2$ | Schottky barrier diode pair |
| $D_3$ | Hyperabrupt variable capacitance diode from 0.5–2.0 pF |
| $S_1$ bias current | 0, 8 mA to 2 mA |
| $R_{11}$ | 7.5 kΩ |
| $R_{12}$ | 2 kΩ |
| $R_{13}$ | 20 kΩ |
| $R_{14}$ | 7.5 kΩ |

What is claimed is:

1. A distortion control circuit for producing a selectively modulated signal comprising:
    a signal input port;
    a non-linear circuit coupled to said input port for selectively modulating a signal received at said input port; said non-linear circuit comprising:
        a pair of diodes coupled together in series;
        first and second capacitors coupled together in series, and coupled in parallel to said diode pair;
        a third capacitor, having a first end coupled between said first and second coupled capacitors and a second end coupled to ground;
        a first resistor coupled at one end to a first end of said diode pair and at a second end to a fourth capacitor, said fourth capacitor being further coupled to ground; and
        a second resistor coupled at one end to a second end of said diode pair and at a second end to ground;
        a third resistor, coupled between said diodes and a fifth capacitor; and
    an output port coupled to said diode pair for outputting said selectively modulated signal from said non-linear circuit; said fifth capacitor coupled between said third resistor and said output port.

2. The circuit of claim 1, further including a first control signal input port between said first resistor and said fourth capacitor.

3. The distortion control circuit of claim 2 further including a low resistance DC bias voltage circuit at said first control signal input port.

4. The circuit of claim 1, wherein said third capacitor is a variable capacitor.

5. The circuit of claim 1, further including a fourth resistor, coupled between said diodes and a sixth capacitor, said sixth capacitor being further coupled to said input port.

6. The distortion control circuit of claim 1, wherein said third capacitor is a variable capacitance diode.

7. The distortion control circuit of claim 6 further including a second control signal input port between said first and second coupled capacitors and said third capacitor.

8. The distortion control circuit of claim 7 further including a fifth resistor between said second control signal input port and said first and second coupled capacitors.

9. A distortion control circuit for producing a selectively modulated signal comprising:
    a signal input port;
    a non-linear circuit coupled to said input port for selectively modulating a signal received at said input port; said non-linear circuit comprising:
        a pair of diodes coupled together in series;
        first and second capacitors coupled together in series, and coupled in parallel to said diode pair;
        a third capacitor, having a first end coupled between said first and second coupled capacitors and a second end coupled to ground;
        a first resistor coupled at one end to a first end of said diode pair and at a second end to a fourth capacitor, said fourth capacitor being further coupled to ground; and
        a second resistor coupled at one end to a second end of said diode pair and at a second end to ground;
    a low resistance DC bias voltage circuit at a first control signal input port between said first resistor and said fourth capacitor;
    a temperature compensation circuit coupled with said bias circuit, for selectively adjusting said DC bias voltage in response to a change in ambient temperature; and
    an output port coupled to said diode pair for outputting said selectively modulated signal from said non-linear circuit.

10. The distortion control circuit of claim 9, whereby said bias circuit comprises at least one resistor having a positive temperature coefficient.

* * * * *